US009001013B2

(12) United States Patent
Hung et al.

(10) Patent No.: US 9,001,013 B2
(45) Date of Patent: Apr. 7, 2015

(54) SHIFT REGISTER CIRCUITRY, DISPLAY AND SHIFT REGISTER

(71) Applicant: AU Optronics Corp., Hsin-Chu (TW)

(72) Inventors: Sen-Chuan Hung, Hsin-Chu (TW); Chun-Yen Liu, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 149 days.

(21) Appl. No.: 13/865,173

(22) Filed: Apr. 17, 2013

(65) Prior Publication Data

US 2013/0321372 A1 Dec. 5, 2013

(30) Foreign Application Priority Data

Jun. 5, 2012 (TW) .............................. 101120118 A

(51) Int. Cl.
*G09G 3/32* (2006.01)
*G11C 19/00* (2006.01)
*G09G 3/20* (2006.01)
*G11C 19/18* (2006.01)
*G11C 19/28* (2006.01)

(52) U.S. Cl.
CPC *G11C 19/00* (2013.01); *G09G 3/20* (2013.01); *G11C 19/184* (2013.01); *G11C 19/28* (2013.01); *G09G 3/3266* (2013.01)

(58) Field of Classification Search
CPC .... G09G 3/30–3/3291; G09G 3/3611–3/3696; G09G 2310/02–2310/068
USPC ......... 345/36, 45, 46, 64–72, 76–82, 87–104, 15/169.3; 365/78, 189.12, 240; 345/208–213, 690–699; 377/29, 54, 57–81; 3380/265, E3.022; 340/12.21; 711/109
See application file for complete search history.

(56) References Cited

U.S. PATENT DOCUMENTS

| 8,392,775 | B2 | 3/2013 | Liu | |
|---|---|---|---|---|
| 8,604,846 | B2 | 12/2013 | Cheng | |
| 2005/0275614 | A1* | 12/2005 | Kim et al. | ...................... 345/100 |
| 2008/0055282 | A1 | 3/2008 | Lee | |
| 2008/0079676 | A1* | 4/2008 | Pak et al. | ......................... 345/87 |
| 2010/0207928 | A1* | 8/2010 | Lee et al. | ...................... 345/213 |
| 2012/0162187 | A1* | 6/2012 | Lee et al. | ...................... 345/212 |
| 2013/0027287 | A1* | 1/2013 | Lee et al. | ......................... 345/94 |

FOREIGN PATENT DOCUMENTS

| CN | 101697284 A | 4/2010 |
|---|---|---|
| CN | 102184699 A | 9/2011 |
| CN | 102201194 | 9/2011 |

\* cited by examiner

*Primary Examiner* — Sanghyuk Park
(74) *Attorney, Agent, or Firm* — Winston Hsu; Scott Margo

(57) ABSTRACT

A shift register circuitry includes plurality stages of shift registers. An Nth stage shift register of the plurality stages of shift registers includes an input unit, an output unit, a control unit, a first pull-up unit, a second pull-up unit and a compensation circuit. The output unit is used to output an unmodified Nth stage scan signal. The input unit and the first pull-up unit are used to control the voltage level of a register control end. The control unit is used to receive a low reference voltage, a high reference voltage and the voltage level of the register control end, and control the voltage level of an output end of the control unit. The second pull-up unit is used to control the voltage level of an output end of the Nth stage shift register. The modification circuit is used to generate a modified Nth stage scan signal.

19 Claims, 6 Drawing Sheets

SHIFT REGISTER CIRCUITRY, DISPLAY AND SHIFT REGISTER

BACKGROUND

1. Technical Field

The present invention relates to a shift register circuitry, especially relating to a shift register circuitry including a plurality of stages of shift registers. Each of the plurality of stages of shift registers is configured to provide an unmodified scan signal and a modified scan signal of said each of the plurality of stages of shift registers.

2. Description of the Prior Art

Liquid crystal displays, light emitting diode displays and organic light emitting diode displays are widely used nowadays. In general, the liquid crystal display, light emitting diode display and organic light emitting diode display have a plurality of pixel units, a source driver and a shift register circuitry. The source driver is used to provide a plurality of data signals to the plurality of pixel units. The shift register circuitry includes a plurality of stages of gate driving circuits to generate a plurality of gate signals configured to be fed to the plurality of pixel units, to control the writing operation of the plurality of data signals. Thus, the shift register circuitry is a key element to control the writing operation of the plurality of data signals.

Please refer to FIGS. 1 and 2. FIG. 1 shows a driving circuit 100 of a related art OLED display. As shown in FIG. 1, the driving circuit 100 includes the first switch T1 to the sixth switch T6, the capacitors C1 and C2 and the organic light emitting diode OLED. The first switch T1 is used to receive the data signal Vdata, and the first switch T1 and the fifth switch T5 are controlled by the Nth stage scan signal S_N to be turned on and off. The sixth switch is used to receive the initial signal Vint, and is controlled by the (N−1)th stage scan signal S_(N−1) to be turned on and off. The second switch T2 and the fourth switch T4 are controlled by the enabling signal EM to be turned on and off, and the source end of the second switch T2 is coupled to the voltage source VDD. The Nth stage scan signal S_N and the (N−1)th stage scan signal S_(N−1) are generated by the shift register circuitry in the OLED display and are transmitted to the driving circuit 100.

FIG. 2 is a timing chart showing the operation of the driving circuit 100 in FIG. 1. As shown in FIG. 2, because the Nth stage scan signal S_N and the (N−1)th stage scan signal S_(N−1) are substantially partial overlapping each other as the dotted line shows below "t2", the OLED may not correctly display colors according to data signals. For example, at the timing t1, when the (N−1)th stage scan signal S_(N−1) is low, the sixth switch T6 will be turned on, which makes the gate end of the third switch have the voltage level of Vint. At the timing t2, when the voltage level of the Nth stage scan signal S_N is low, the first switch T1 will be turned on. Because the sixth switch T6 is not fully turned off at the timing t2, the third switch T3 will synchronously receive the initial signal Vint and the data signal Vdata, and thus making the OLED display improper colors according to the data signal Vdata.

SUMMARY

An embodiment of the present invention relates to a shift register circuitry, which comprises a plurality of stages of shift registers, and each of the plurality of stages of shift registers is configured to provide an unmodified scan signal and a modified scan signal of said each of the plurality of stages of shift registers. An Nth stage shift register of the plurality of stages of shift registers comprises an output unit, an input unit, a first control unit, a first pull-up unit, a second pull-up unit and a modification circuit. The output unit is coupled to a register control end of the Nth stage shift register configured to receive a first clock, and outputting an unmodified Nth stage scan signal from a first output end of the Nth shift register according to the first clock and voltage level of the register control end. The input unit is coupled to the output unit through the register control end, configured to receive a second clock other than the first clock, receiving an unmodified (N−M) stage scan signal provided by an (N−M)th stage shift register of the plurality of stages of shift registers, and controlling the voltage level of the register control end according to the unmodified (N−M)th stage scan signal and the second clock. The first control unit is coupled to the register control end, configured to receive a low reference voltage, a high reference voltage and the voltage level of the register control end, and controlling voltage level of an output end of the first control unit according to the voltage level of the register control end. The first pull-up unit is coupled to the output end of the first control unit and the register control end, configured to receive the high reference voltage and the voltage level of the first control unit, and controlling the voltage level of the register control end according to the voltage level of the output end of the first control unit. The second pull-up unit is coupled to the output end of the first control unit and the output unit, configured to receive the high reference voltage, and controlling the voltage level of an output end of the Nth stage shift register. The modification circuit is coupled to the output end of the first control unit and the first output end of the Nth stage shift register, configured to receive the unmodified Nth stage scan signal, the high reference voltage, the second clock, a first enabling signal and a second enabling signal, and generating a modified Nth stage scan signal at a second output end of the Nth stage shift register according to the unmodified Nth stage scan signal.

Another embodiment of the present invention relates to a display, which comprises a plurality of pixels, a data driver, a signal generating circuit, a power supply circuit and a scan driver. The data driver is coupled to the pixels configured to individually provide display signals to the pixels. The signal generating circuit comprises a first clock output end, a second clock output end, a first enabling signal output end and a second enabling signal output end. The first clock output end is configured to provide a first clock, the second clock output end is used configured to provide a second clock other than the first clock, the first enabling signal output end is configured to provide a first enabling signal, and the second enabling signal output end is configured to provide a second enabling signal other than the first enabling signal. The power supply circuit comprises a high reference voltage output end configured to provide a high reference voltage and a low reference voltage output end configured to provide a low reference voltage. The scan driver is coupled to the pixels configured to provide a plurality of scan signals to control the pixels individually receiving display signals, the scan driver comprises a shift register circuitry comprising a plurality of stages of shift registers. Each of the plurality of stages of shift registers is configured to provide an unmodified scan signal and a modified scan signal of the each of the plurality of stages of shift registers. An Nth stage shift register of the plurality of stages of shift registers comprises an output unit, an input unit, a first control unit, a first pull-up unit, a second pull-up unit and a modification circuit. The output unit is coupled to a register control end of the Nth stage shift register configured to receive a first clock, and outputting an unmodified Nth stage scan signal from a first output end of the Nth shift register according to the first clock and voltage level of the register control end. The input unit is coupled to the output unit through the register control end, configured to receive a second clock other than the first clock, receiving an unmodified (N−M) stage scan signal provided by an (N−M)th stage shift register of the plurality of stages of shift registers, and controlling the voltage level of the register control end according to the unmodified (N−M)th stage scan signal and the second clock. The first control unit is coupled to the register control end, configured to receive a low reference voltage, a high reference voltage and the voltage level of the register control end, and controlling voltage level of an output end of the first control unit according to the voltage level of the register control end. The first pull-up unit is coupled to the output end of the first control unit and the register control end, configured to receive the high reference voltage and the voltage level of the first control unit, and controlling the voltage level of the register control end according to the voltage level of the output end of the first control unit. The second pull-up unit is coupled to the output end of the first control unit and the output unit, configured to receive the high reference voltage, and controlling the voltage level of an output end of the Nth stage shift register. The modification circuit is coupled to the output end of the first control unit and the first output end of the Nth stage shift register, configured to receive the unmodified Nth stage scan signal, the high reference voltage, the second clock, a first enabling signal and a second enabling signal, and generating a modified Nth stage scan signal at a second output end of the Nth stage shift register according to the unmodified Nth stage scan signal.

Another embodiment of the present invention relates to a shift register comprising an output unit, an input unit, a first control unit, a first pull-up unit, a second pull-up unit and a modification circuit. The output unit comprises a first switch having a first end configured to receive a first clock, a second end configured to output an unmodified Nth stage scan signal, and a control end coupled to a register control end of the shift register. The input unit comprises a second switch, a third switch and a fourth switch. The second switch has a first end, a control end configured to receive a second clock, and a second end configured to receive an unmodified (N−M)th stage scan signal. The third switch has a first end coupled to the second end of the second switch, a control end configured to receive the second clock, and a second end coupled to the register control end. The fourth switch has a first end coupled to a first output end of the Nth stage shift register, a second end coupled to the first end of the second switch, and a control end coupled to the first end of the fourth switch. The first control unit comprises a switch set and a fifth switch. The switch set has a first end and a control end configured to receive a low reference voltage. The fifth switch has a first end coupled to a second end of the switch set, a control end coupled to the register control end, and a second end configured to receive a high reference voltage. The first pull-up unit is configured to pull up voltage level of the register control end, and the first pull-up unit has a first end coupled to the first end of the register control end, a control end, and a second end configured to receive the high reference voltage. The second pull-up unit has a first end configured to output the unmodified Nth stage scan signal, a control end coupled to the first control unit, and a second end configured to receive the high reference voltage. The modification circuit comprises a sixth switch, a seventh switch, an eighth switch, a ninth switch and a tenth switch. The sixth switch has a first end coupled to the control end of the first pull-up unit, a control end configured to receive a first enabling signal, and a second end coupled to the first output end of the Nth shift register. The seventh switch has a first end configured to output the modified Nth stage scan signal, a control end coupled to an output end of the first control unit, and a second end configured to receive the high reference voltage. The eighth switch has a first end coupled to the first end of the seventh switch, a second end configured to receive the second clock, and a control end configured to receive the high reference voltage. The ninth switch has a first end configured to receive a second enabling signal, a control end coupled to the first end of the sixth switch, and a second end coupled to the first end of the seventh switch. The tenth switch has a first end coupled to the first end of the seventh switch, a control end configured to receive the first enabling signal, and a second end configured to receive the high reference voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
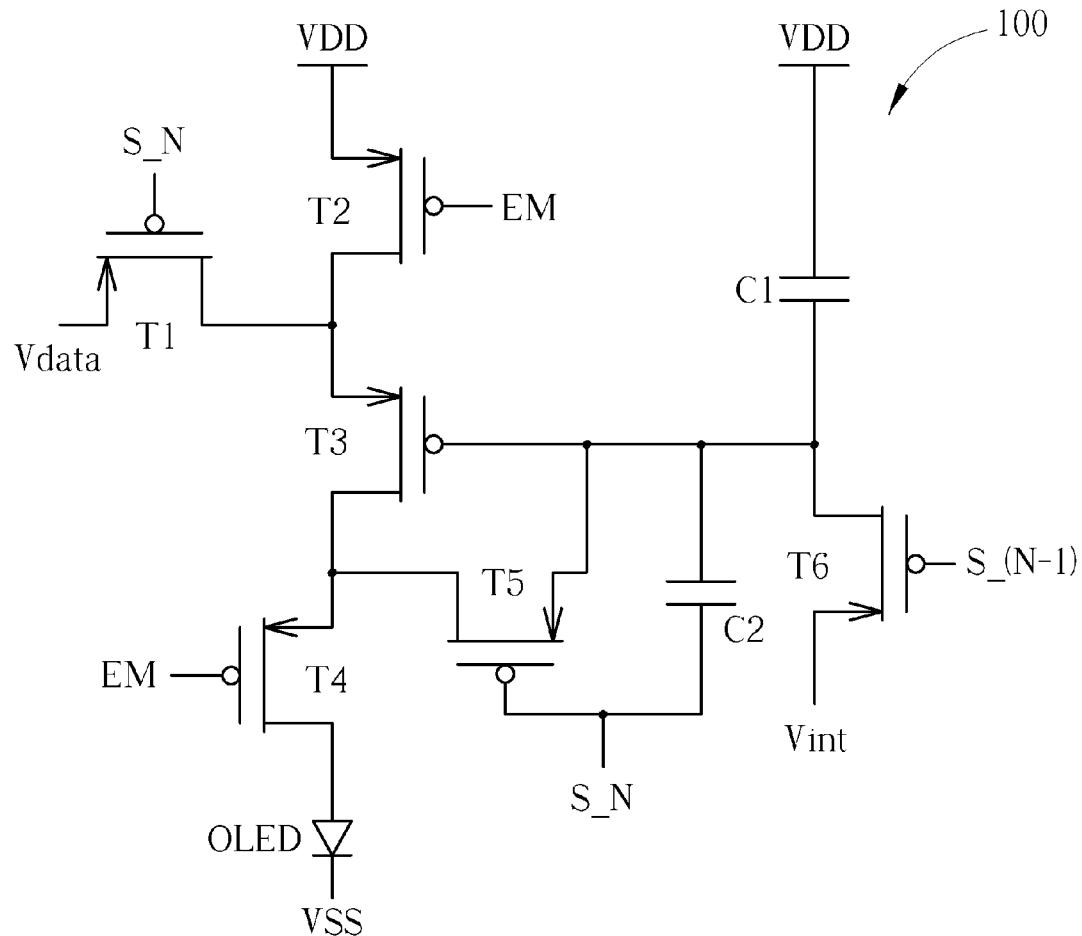
FIG. 1 shows a driving circuit of a related art OLED display.
Figure 2:
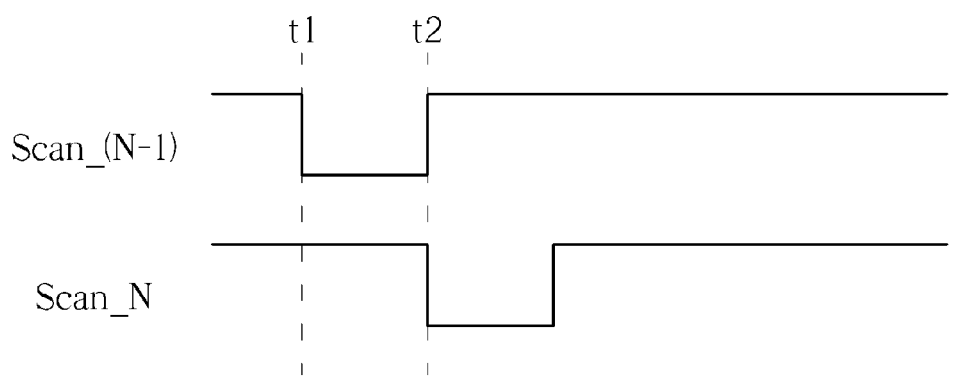
FIG. 2 is a timing chart showing the operation of the driving circuit in FIG. 1.

The detailed descriptions of the present invention are exemplified below in examples. However, the examples are merely used to illustrate the present invention, not to limit the present invention. Because one skilled in the art may modify the present invention or combine the present invention with some features within the scope of the present invention, the claimed scope of the present invention should be referred to in the following claims.

In the entire specification and claims, unless the contents clearly specify the meaning of some terms, the terms "a" or "the" may refer to one or at least one of elements or components. Besides, in the present disclosure, unless it can be clearly seen from the relating context that the examples or embodiments do not refer to multiple elements or components, singular articles may refer to one or at least one of elements or components. The meanings of every term used in the present claims and specification refer to a usual meaning known to one skilled in the art unless the meaning is additionally annotated. Some terms used to describe the present invention will be discussed to guide practitioners about the present invention. Every example in the present specification cannot limit the claimed scope of the present invention.

The terms "substantially," "around," "about" and "approximately" can refer to within 20% of a given value or range, and preferably within 10%. Besides, the quantities provided herein can be approximate ones and can be described with the aforementioned terms if are without being specified. When a quantity, density, or other parameters includes a specified range, preferable range or listed ideal values, their values can be viewed as any number within the given range. For example, if it is described that the length of a component is X cm to Y cm, then it is equivalent to sentence "the length of the component is H, and H can be any real number value between the values of X and Y."

Further, in the present specification and claims, the term "comprising" is open type and should not be viewed as the term "consisted of." Besides, the term "electrically coupled" can be referring to either directly connecting or indirectly connecting between elements. Thus, if it is described in the below contents of the present invention that a first device is electrically coupled to a second device, the first device can be directly connected to the second device, or indirectly connected to the second device through other devices or means. Moreover, when the transmissions or generations of electrical signals are mentioned, one skilled in the art should understand some degradations or undesirable transformations could be generated during the operations. If it is not specified in the specification, an electrical signal at the transmitting end should be viewed as substantially the same signal as that at the receiving end. For example, when the end A of an electrical circuit provides an electrical signal S to the end B of the electrical circuit, the voltage of the electrical signal S may drop due to passing through the source and drain of a transistor or due to some parasitic capacitance. However, the transistor is not deliberately used to generate the effect of degrading the signal to achieve some result, that is, the signal S at the end A should be viewed as substantially the same as that at the end B.

Furthermore, it can be understood that the terms "comprising," "including," "having," "containing," and "involving" are open-ended terms, which refer to "may include but is not limited to so." Besides, each of the embodiments or claims of the present invention is not necessary to achieve all the effects and advantages possibly to be generated, and the abstract and title of the present invention is used to assist for patent search and is not used to further limit the claimed scope of the present invention.

The embodiments and figures are provided as follows in order to illustrate the present invention in detail, but please notice that the claimed scope of the present invention is not limited by the provided embodiments and figures.

Figure 3:
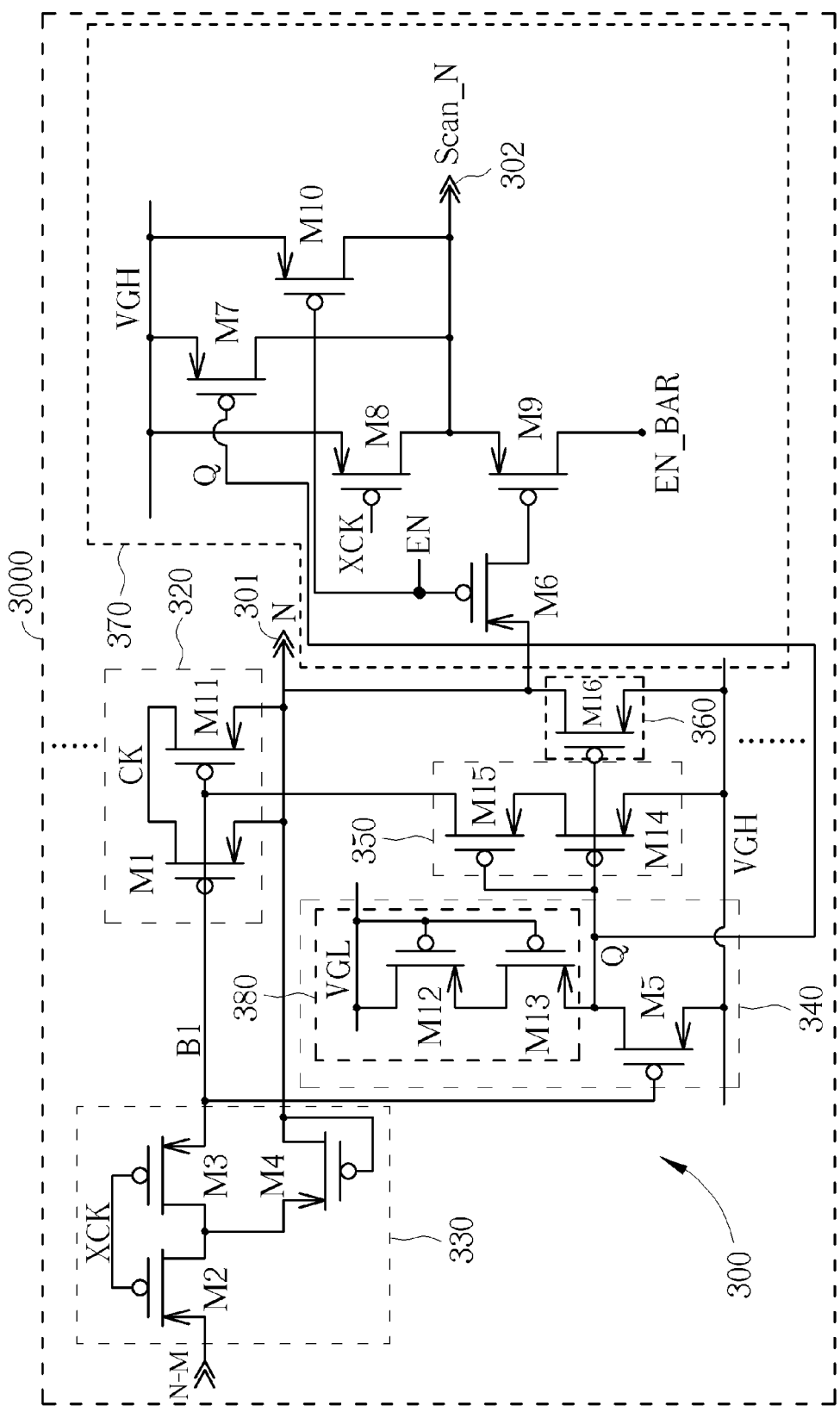
FIG. 3 shows a shift register circuitry of a first embodiment of the present invention.

Please refer to FIG. 3, which shows a shift register circuitry 3000 of a first embodiment of the present invention. The shift register circuitry 3000 comprises a plurality of stages of shift registers, and each of the plurality of stages of shift registers is used configured to provide an unmodified scan signal N and a modified scan signal Scan_N of said each of the plurality of stages of shift registers. An Nth stage shift register 300 of the plurality of stages of shift registers comprises an output unit 320, an input unit 330, a first control unit 340, a first pull-up unit 350, a second pull-up unit 360 and a modification circuit 370. The output unit 320 is coupled to a register control end B1 of the Nth stage shift register 300 configured to receive a first clock CK, and outputting an unmodified Nth stage scan signal N at the first output end 301 of the Nth shift register circuitry according to the first clock CK and voltage level of the register control end B1. The input unit 330 is coupled to the output unit 320 through the register control end B1, configured to receive a second clock XCK other than the first clock CK, receiving an unmodified (N–M) stage scan signal (N–M) provided by an (N–M)th stage shift register of the plurality of stages of shift registers, and controlling the voltage level of the register control end B1 according to the unmodified (N–M)th stage scan signal (N–M) and the second clock XCK. The first control unit 340 is coupled to the register control end B1 configured to receive a low reference voltage VGL, a high reference voltage VGH and the voltage level of the register control end B1, and controlling voltage level of an output end Q of the first control unit 340 according to the voltage level of the register control end B1. The first pull-up unit 350 is coupled to the output end Q of the first control unit 340 and the register control end B1, configured to receive the high reference voltage VGH and the voltage level of the first control unit 340, and controlling the voltage level of the register control end B1 according to the voltage level of the output end Q of the first control unit 340. The second pull-up unit 360 is coupled to the output end Q of the first control unit 340 and the output unit 320 configured to receive the high reference voltage VGH, and controlling the voltage level of an output end 301 of the Nth stage shift register 300. The modification circuit 370 is coupled to the output end Q of the first control unit 340 and the first output end 301 of the Nth stage shift register, configured to receive the unmodified Nth stage scan signal N, the high reference voltage VGH, the second clock XCK, a first enabling signal EN and a second enabling signal EN_BAR, and generating a modified Nth stage scan signal Scan_N at a second output end 302 of the Nth stage shift register 300 according to the unmodified Nth stage scan signal N.

In the first embodiment, N and M are both positive integers, and M is smaller than N. The values of N and M are not further limited. configured for example, if the value of M is 1, the unmodified (N–M) stage scan signal (N–M) will be unmodified (N–1) stage scan signal (N–1), and this represents that the Nth stage shift register 300 receives the scan signal outputted by a previous stage shift register. if the value of M is 2, the unmodified (N–M) stage scan signal (N–M) will be unmodified (N–2) stage scan signal (N–2), and this represents that the Nth stage shift register 300 receives the scan signal outputted by a shift register two stages before the current stage, and so on. Besides, regarding the first shift register, dummy previous stages shift registers are required to provide the previous stages signals to the first stage shift register, and those dummy shift registers are usually not used to drive pixels, but are configured to provide signals for next stages of shift registers. That is, the shift registers in the present invention are not limited to only receive the scan signal provided by the previous stage shift register.

The output unit 320 comprises a first switch M1 and an eleventh switch M11. The first switch M1 has a first end configured to receive the first clock CK, a second end configured to output the unmodified Nth stage scan signal N, and a control end coupled to the register control end B1. The eleventh switch M11 has a first end configured to receive the first clock CK, a second end configured to output the unmodified Nth stage scan signal N and a control end coupled to the register control end B1. The first switch M1 and the eleventh switch M11 are connected in parallel. Although in this embodiment, the output unit 320 is configured to have two switches connected in parallel, however, the output unit can be also configured to have more switches connected in parallel or to have only one switch.

The input unit comprises a second switch M2, a third switch M3 and a fourth switch M4. The second switch has a first end, a control end configured to receive the second clock XCK, and a second end configured to receive the unmodified (N–M)th stage scan signal (N–M). The third switch has a first end coupled to the second end of the second switch M2, a control end configured to receive the second clock XCK, and a second end coupled to the register control end B1. The fourth switch has a first end coupled to the first output end 301 of the Nth stage shift register 300, a second end coupled to the first end of the second switch M2, and a control end coupled to the first end of the fourth switch M4.

The first control unit 340 comprises a switch set 380 and a fifth switch M5. The switch set 380 has a control end, a first end configured to receive the low reference voltage VGL, and the second end coupled to the output end Q of the first control unit 340. The fifth switch M5 has a first end coupled to a second end of the switch set 380, a control end coupled to the register control end B1, and a second end configured to receive the high reference voltage VGH. The switch set 380 and the fifth switch M5 are used to provide the function of an inverter, configured for example, when a signal is transmitted to the control end of the fifth switch M5, a signal logically inversed to the signal being transmitted to the control end of the fifth switch M5 will be generated.

The switch set 380 comprises a twelfth switch M12 and a thirteenth switch M13. The twelfth switch M12 has a first end configured to receive the low reference voltage VGL, a control end configured to receive the low reference voltage VGL, and a second end. The thirteenth switch M13 has a first end coupled to the second end of the twelfth switch M12, a control end configured to receive the low reference voltage VGL, and a second end coupled to the first end of the fifth switch M5. The twelfth switch M12 and the thirteenth switch M13 are connected in cascode fashion. Although in the illustration of the first embodiment, the switch set 380 only includes the twelfth switch M12 and the thirteenth switch M13, however, the preset invention does not limit that the switch set 380 can be only configured to include the twelfth switch M12 and the thirteenth switch M13. The switch set 380 can be configured to include more cascode switches, or can be configured to include a single switch.

The first pull-up unit 350 comprises a fourteenth switch M14 and a fifteenth switch M15. The fourteenth switch M1 has a first end, a control end coupled to the output end Q of the first control unit 340, and a second end configured to receive the high reference voltage VGH. The fifteenth switch M15 has a first end coupled to the register control end B1, a control end coupled to the control end of the fourteenth switch M14, and a second end coupled to the first end of the fourteenth switch M14. The fourteenth switch M14 and the fifteenth switch M15 are configured to be connected in cascode fashion. Although in the illustration of the first embodiment, the first pull-up unit 350 only includes the fourteenth switch M14 and the fifteenth switch M15, the present invention does not limit that the first pull-up unit 350 can be only configured to include two switches connected in cascode fashion. The first pull-up unit 350 can be configured to includes more switches connected in cascode fashion, or can be configured to include a single switch.

The second pull-up unit 360 has a sixteenth switch M16 which has a first end configured to output the unmodified Nth stage scan signal N, a control end coupled to the first control unit 340, and a second end configured to receive the high reference voltage VGH. The present invention does not limit that the second pull-up unit 360 can only include the sixteenth switch M16. The sixteenth switch M16 can be replaced with other elements, and the second pull-up unit 360 can be configured to include more switches.

The modification circuit comprises a sixth switch M6, a seventh switch M7, an eighth switch M8, a ninth switch M9 and a tenth switch M10. The sixth switch M6 has a first end, a control end configured to receive the first enabling signal EN, and a second end coupled to the first output end 301 of the Nth shift register 300. The seventh switch M7 has a first end configured to output the modified Nth stage scan signal Scan_N, a control end coupled to the output end Q of the first control unit 340, and a second end configured to receive the high reference voltage VGH. The eighth switch M8 has a first end coupled to the first end of the seventh switch M7, a second end configured to receive the second clock XCK, and a control end configured to receive the high reference voltage VGH. The ninth switch M9 has a first end configured to receive the second enabling signal EN_BAR, a control end coupled to the first end of the sixth switch M6, and a second end coupled to the first end of the seventh switch M7. The tenth switch M10 has a first end coupled to the first end of the seventh switch M7, a control end configured to receive the first enabling signal EN, and a second end configured to receive the high reference voltage VGH.

Figure 4:
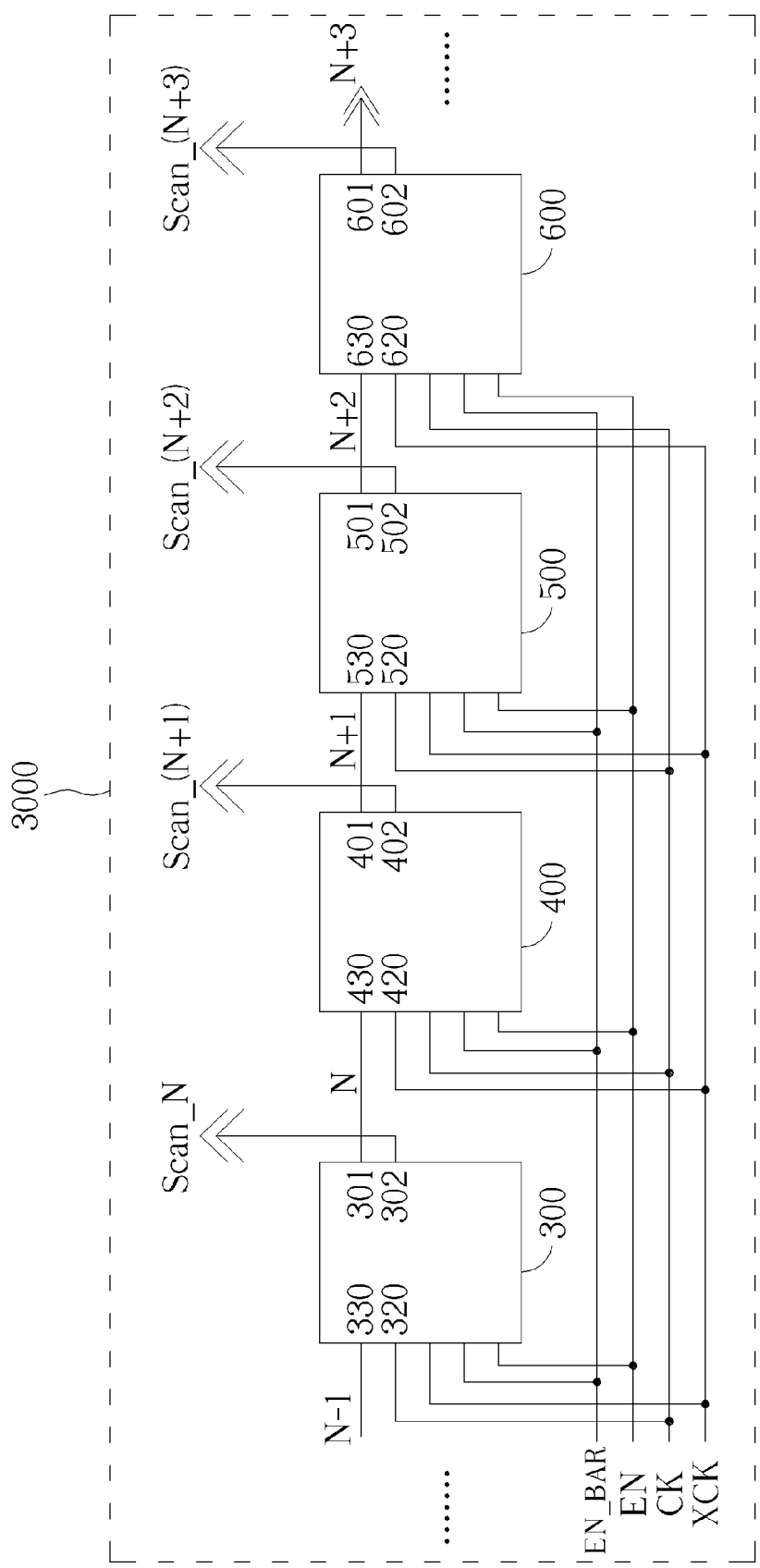
FIG. 4 shows the structure that couples a plurality of shift register of FIG. 3.
Figure 5:
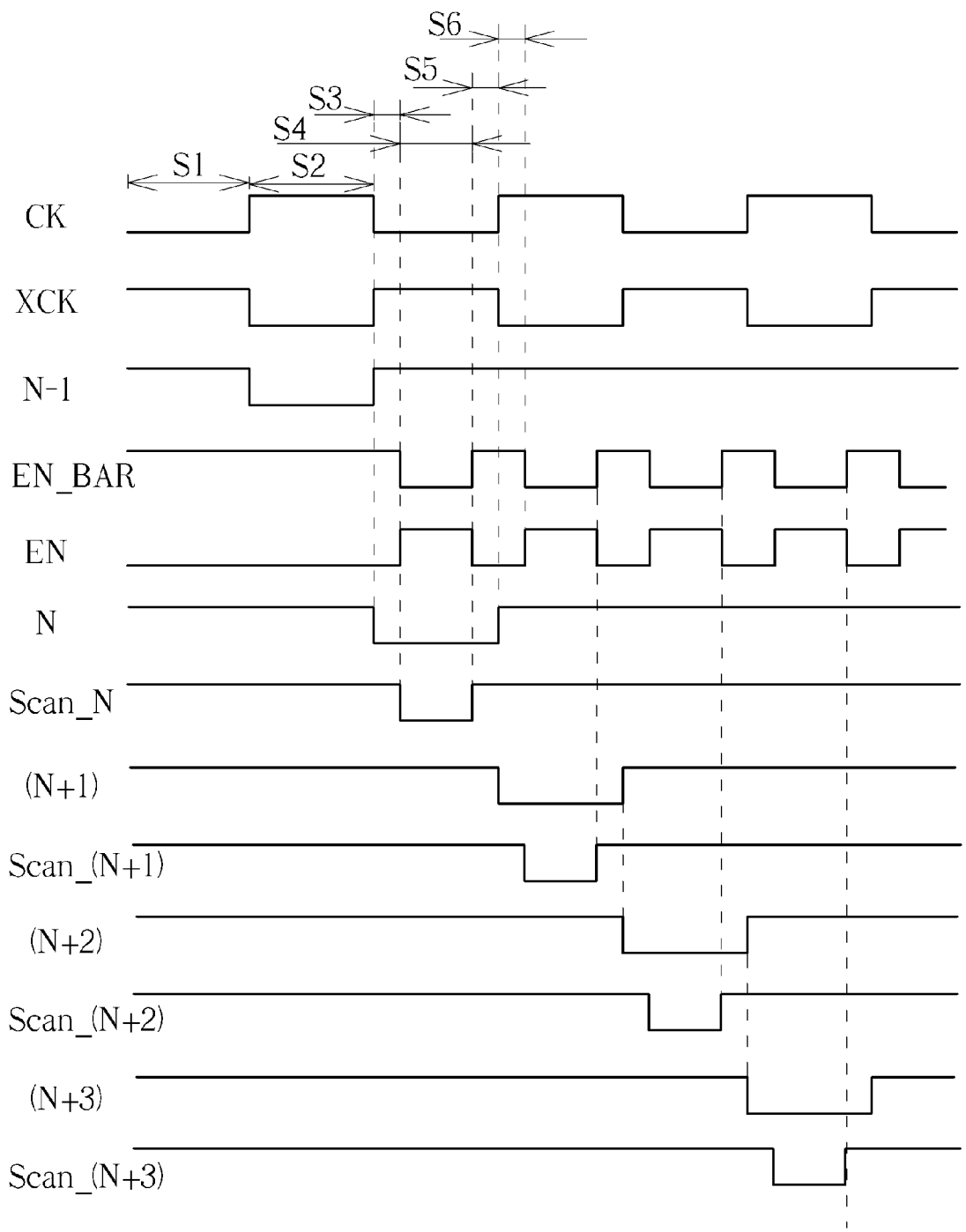
FIG. 5 shows a timing chart corresponding to FIGS. 3 and 4.

Please refer to FIGS. 3-5. FIG. 4 shows the structure that couples a plurality of shift registers of FIG. 3. The connection of the Nth stage shift register 300 to the (N+3)th stage shift register 600 is shown in FIG. 4. The structures of shift registers 300 to 600 are identical to one another. The input unit 330 of the Nth stage shift register 300 is used to receive the unmodified (N−1)th stage scan signal (N−1) transmitted by the previous stage shift register, the first output end 301 is used to output the unmodified N stage scan signal N, and the second output end 302 is used to output the modified N stage scan signal Scan_N. The input unit 430 of the (N+1)th stage shift register 400 is used to receive the unmodified Nth stage scan signal N transmitted by the Nth stage shift register 300, the first output end 401 is used to output the unmodified (N+1) stage scan signal (N+1), and the second output end 402 is used to output the modified (N+1) stage scan signal Scan_(N+1). The input unit 530 of the (N+2)th stage shift register 500 is used to receive the unmodified (N+1)th stage scan signal (N+1) transmitted by the (N+1)th stage shift register 400, the first output end 501 is used to output the unmodified (N+2) stage scan signal (N+2), and the second output end 502 is used to output the modified (N+2) stage scan signal Scan_(N+2). The input unit 630 of the (N+3)th stage shift register 600 is used to receive the unmodified (N+2)th stage scan signal (N+2) transmitted by the (N+2)th stage shift register 500, the first output end 601 is used to output the unmodified (N+3) stage scan signal (N+36), and the second output end 602 is used to output the modified (N+3) stage scan signal Scan_(N+3). Besides, each stage of shift registers can receive the first clock CK and the second clock XCK, the first enabling control signal EN and the second enabling control signal EN_BAR, and the second output end of each stage of shift registers can provide input to the driving circuit 100 of a display in FIG. 1. For example, In FIG. 4, the second output end 302 of the Nth stage shift register 300, the second output end 402 of the (N+1)th stage shift register 400, the second output end 502 of the (N+2)th stage shift register 500 and the second output end 602 of the (N+3)th stage shift register 600 can be coupled to the control end of the first switch T1 and the control end of the fifth switch T5 of the driving circuit 100, configured to provide inputs to the first driving circuit 100. The way the Nth stage shift register receives the first clock CK and the second clock XCK is the same as does the (N+2)th stage shift register 500, but inverse to the (N+1)th stage shift register 400 and (N+3)th stage shift register 600, and so on, e.g. in the Nth stage shift register 300, the input unit 330 receives the second clock XCK and the output unit 320 receives the first clock CK, while in the (N+1)th stage shift register 400, the input unit 430 receives the first clock Ck and the output unit 420 receives the second clock XCK.

Please refer to FIG. 5, which shows a timing chart corresponding to FIGS. 3 and 4. As shown in FIG. 5, the phases of the first enabling signal EN are logically inversed relative to phases of the second enabling signal EN_BAR, and the phases of the first clock CK are logically inversed relative to phases of the second clock XCK. After receiving the unmodified (N−1)th stage scan signal (N−1), the first clock CK, the second clock XCK, the first enabling signal EN and the second enabling signal EN_BAR, the Nth stage shift register 300 will generate the unmodified Nth stage scan signal N at the second end of the first switch M1 of the output unit 320. Different from the situation that the unmodified Nth stage scan signal N and the unmodified (N+1)th stage scan signal (N+1) substantially partially overlaps each other, the modified Nth stage scan signal Scan_N and the modified (N+1)th stage scan signal Scan_(N+1) do not overlap each other, thus solving the problem of the related art driving circuit 100 of the OLED display that the gate end of the third switch T3 receives the initial signal Vint and the source end of the third switch T3 synchronously receives data signal which makes the OLED unable to emit correct light. The present invention does not limit the shift register circuitry 3000 of this embodiment to only be applied to OLED displays. Besides, the modified (N+1)th stage scan signal Scan_(N+1) does not overlap the modified (N+2)th stage scan signal Scan_(N+2), and the modified (N+2)th stage scan signal Scan_(N+2) does not overlap the modified (N+3)th stage scan signal Scan_(N+3). Please refer to FIGS. 3 and 5. During the period S1, because the voltage level of the first clock CK is low and the voltage level of the second clock XCK is high, the second switch M2 and the third switch M3 will be turned off, and because the voltage level of the register control end B1 is pulled to high by the high reference voltage VGH, the fifth switch M5 will be turned off during the first period S1 and the register control end B1 is latched to high voltage level, thus the first switch M1 and the eleventh switch M11 are turned off. At this moment, because the voltage level of the output end Q will be pulled to low by the low reference voltage VGL, the fourteenth switch M14, the fifteenth switch M15 and the sixteenth switch M16 will be turned on, and the unmodified Nth stage scan signal is kept at a high voltage level. Further, because the voltage level of the first enabling signal EN is low, the tenth switch M10 will be turned on, which makes the modified Nth stage scan signal Scan_N to be pulled to high by the high reference voltage VGH, configured to output high voltage level signals.

During the period S2, because the voltage level of the first clock CK is high and the voltage level of the second clock XCK is low, the second switch M2 and the third switch M3 will be turned on, and because the unmodified (N−1)th stage scan signal (N−1) is low, the register control end B1 will be pulled from a high voltage level to a low voltage level by the unmodified (N−1)th stage scan signal (N−1), thus turning on the fifth switch M5, the first switch M1 and the eleventh switch M11, and makes the unmodified Nth stage scan signal N output the high voltage level of the first clock CK. At this moment, because the fifth switch M5 has been turned on, the voltage level of the output end Q will be pulled to high by the high reference voltage VGH, thus turning off the fourteenth switch M14, the fifteenth switch M15 and the sixteenth switch M16. Further, because the voltage level of the first enabling signal EN is low, the tenth switch M10 will be turned on, which makes the modified Nth stage scan signal Scan_N to be kept at the high voltage level by the high reference voltage VGH, configured to output high voltage level signals.

During the period S3, because the voltage level of the first clock CK is low and the voltage level of the second clock XCK is high, the second switch M2 and the third switch M3 will be turned off, and because the voltage level of the register control end B1 is already low in the period S2, in the period S3, the fifth switch M5, the first switch M1 and the eleventh switch M11 will be turned on, and the unmodified Nth stage scan signal N will be pulled to low by the low reference voltage VGL. At this moment, because the output end Q is kept at the voltage level of the high reference voltage level VGH due to the turning on of the fifth switch M5, the fourteenth switch M14, the fifteenth switch M15 and the sixteenth switch M16 will be turned off. Further, because the voltage level of the first enabling signal EN is low, the tenth switch M10 will be turned on, which makes the modified Nth stage scan signal Scan_N to be pulled to the high voltage level by the high reference voltage VGH, configured to output high voltage level signals.

During the period S4, because the voltage level of the first clock CK is low and the voltage level of the second clock XCK is high, the second switch M2 and the third switch M3 will be turned off, and because the voltage level of the register control end B1 is already low in the period S3, in the period S4, the fifth switch M5, the first switch M1 and the eleventh switch M11 will be turned on, and the unmodified Nth stage scan signal N will be pulled to low by the low reference voltage VGL. At this moment, because the output end Q is pulled to high by the high reference voltage level VGH, the fourteenth switch M14, the fifteenth switch M15 and the sixteenth switch M16 will be turned off. Further, because the voltage level of the first enabling signal EN is high and the second enabling control signal EN_BAR is low, the tenth switch M10 will be turned off, the sixth switch M6 will be turned on and the ninth switch M9 will be turned on due to receiving the low voltage level, which makes the modified Nth stage scan signal Scan_N to be pulled to the low voltage level by the second enabling control signal EN_BAR, configured to output low voltage level signals.

During the period S5, because the voltage level of the first clock CK is low and the voltage level of the second clock XCK is high, the second switch M2 and the third switch M3 will be turned off, and because the voltage level of the register control end B1 is already low in the period S4, in the period S5, the fifth switch M5, the first switch M1 and the eleventh switch M11 will be turned on, and the unmodified Nth stage scan signal N will be kept low by the low reference voltage VGL. At this moment, because the output end Q is pulled to high by the high reference voltage level VGH, the fourteenth switch M14, the fifteenth switch M15 and the sixteenth switch M16 will be turned off. Further, because the voltage level of the first enabling signal EN is low, the tenth switch M10 will be turned on, the sixth switch M6 will be turned on, which makes the modified Nth stage scan signal Scan_N to be pulled to high by the high reference voltage VGH, configured to output high voltage level signals.

During the period S6, because the voltage level of the first clock CK is high and the voltage level of the second clock XCK is low, the second switch M2 and the third switch M3 will be turned on, and because the modified (N−1) stage scan signal (N−1) is high, the voltage level of the register control end B1 will be pulled to high by the modified (N−1) stage scan signal (N−1), thus the fifth switch M5, the first switch M1 and the eleventh switch M11 will be turned off. At this moment, because the fifth switch M5 has been turned off, the output end Q will be pulled to low by the low reference voltage level VGL, thus the fourteenth switch M14, the fifteenth switch M15 and the sixteenth switch M16 will be turned on and the unmodified Nth stage scan signal N will be pulled to high by the high reference voltage VGH. Further, because the voltage level of the first enabling signal EN is low, the tenth switch M10 will be turned on, which makes the modified Nth stage scan signal Scan_N to be pulled to high by the high reference voltage VGH, configured to output high voltage level signals. The follow-up operations are similar to the aforementioned operation during the periods S1 to S6. Besides, the operation during the periods S1 to S6 is merely for example, not the limitation of the present invention.

Figure 6:
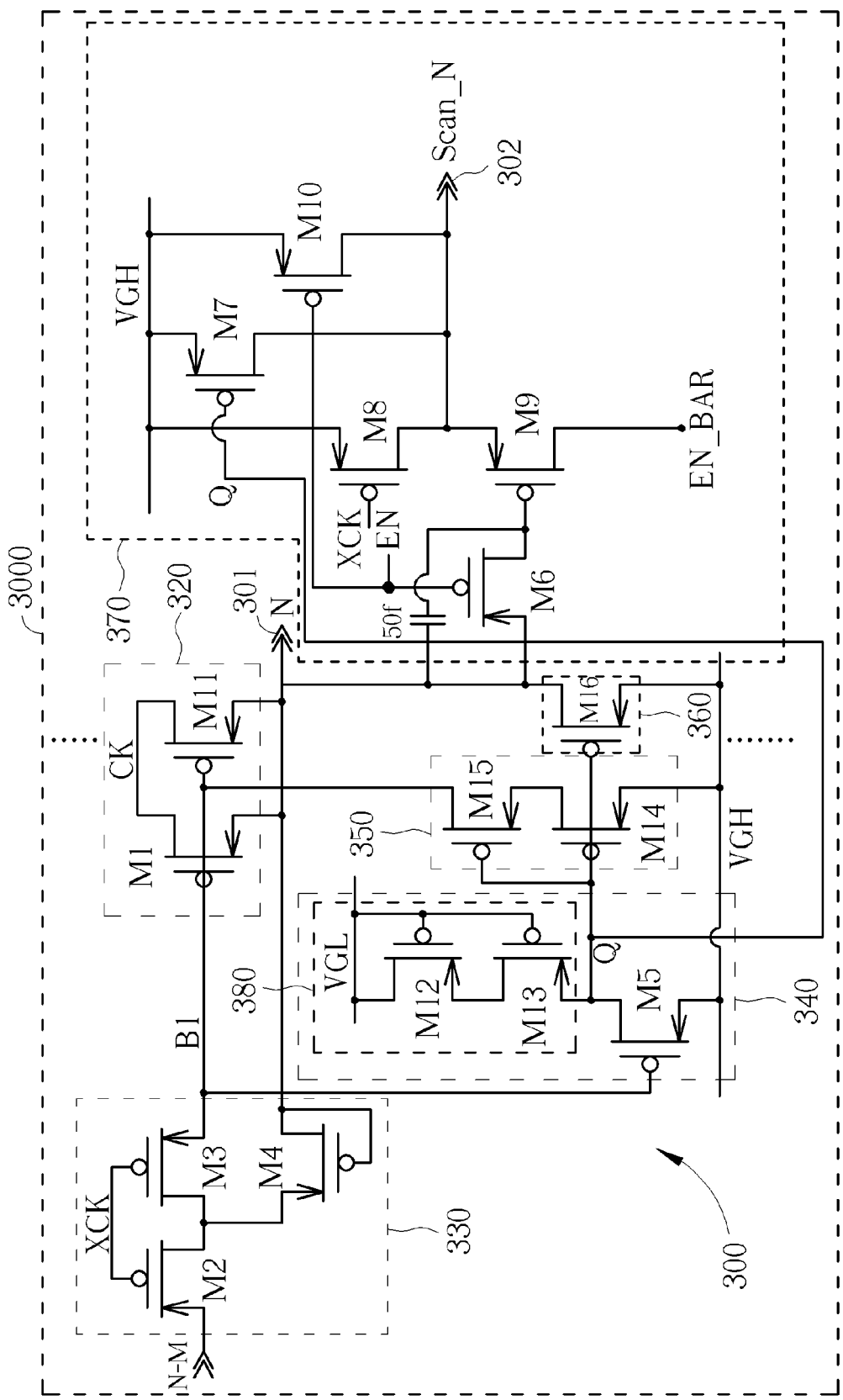
FIG. 6 shows a shift register circuitry of a second embodiment of the present invention.

Please refer to FIG. 6, which shows a shift register circuitry 6000 of a second embodiment of the present invention. As shown in FIG. 6, the difference between the shift register circuitries 3000 and 6000 is that, in the shift register circuitry 6000, the modification circuit further comprises a capacitor Cripp. The capacitor Cripp is coupled between the first and second ends of the sixth switch M6, and the capacitance of the capacitor Cripp is about 50 to 150 Farad. The capacitor Cripp can be used to reduce the glitch at the control end of the ninth switch M9 caused by the second enabling signal EN_BAR. Because the first end of the ninth switch M9 is used to receive the second enabling signal EB_BAR, the ninth switch M9 will generate coupling capacitor, which makes the glitch occurred at the control end of the ninth switch M9.

Figure 7:
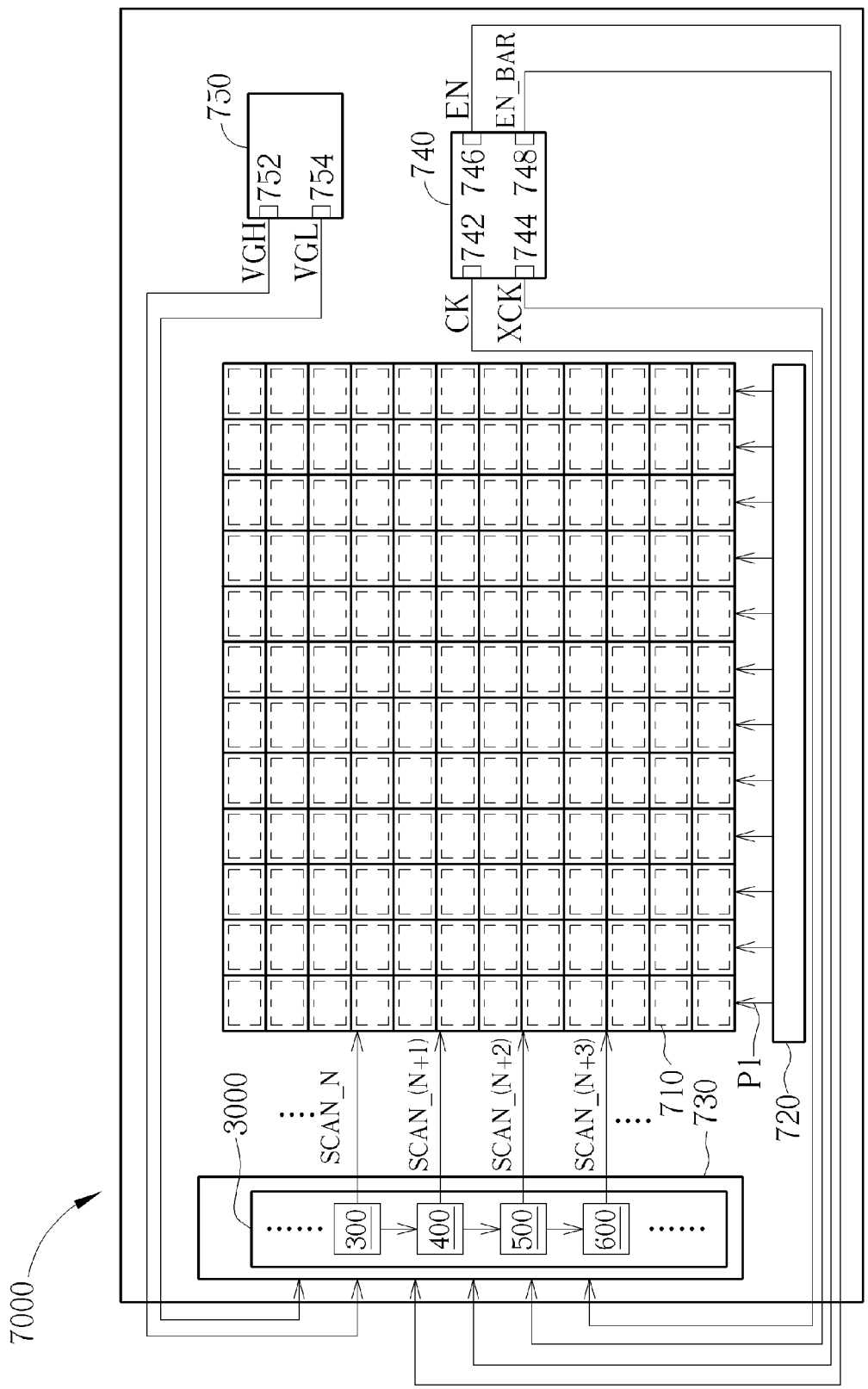
FIG. 7 shows a display including the shift register circuitry in the first embodiment according to a third embodiment of the present invention.

Please refer to FIG. 7, which shows a display 7000 including the shift register circuitry 3000 in the first embodiment according to a third embodiment of the present invention. As shown in FIG. 7, the display 7000 comprises a plurality of pixels 710, a data driver 720, a scan driver 730, a signal generating circuit 740, and a power supply circuit 750. The data driver 720 is coupled to the pixels 710 configured to individually provide display signals to the pixels 710.

The scan driver 730 is coupled to the pixels 710 configured to provide a plurality of scan signals to control the pixels 710 individually receiving display signals from the data driver 720. For example, the shift register circuitry respectively providing modified Nth stage scan signal Scan_N, the modified (N+1)th stage scan signal Scan_(N+1), the modified (N+2)th stage scan signal Scan_(N+2) and the modified (N+3)th stage scan signal Scan_(N+3) to the pixels 710 through the shift registers inside the shift register circuitry 3000 such as the (N+1)th stage shift register 400, the (N+2)th stage shift register 500 and the (N+3)th stage shift register 600. Besides, each of the aforementioned modified scan signals can be used as a scan signal.

The signal generating circuit 740 comprises a first clock output end 742, a second clock output end 744, a first enabling signal output end 746 and a second enabling signal output end 748. The first clock output end 742 is configured to provide the first clock CK, the second clock output end 744 is used configured to provide the second clock XCK other than the first clock CK, the first enabling signal output end 746 is configured to provide the first enabling signal EN, and the second enabling signal output end 748 is configured to provide the second enabling signal EN_BAR other than the first enabling signal EN. The power supply circuit 750 comprises a high reference voltage output end 752 configured to provide the high reference voltage VGH and the low reference voltage output end 754 configured to provide the low reference voltage VGL. The power supply circuit 750 comprises a high reference voltage output end 752 configured to provide a high reference voltage VGH, and a low reference voltage output end 754 configured to provide a low reference voltage VGL. The shift register circuitry 3000 is coupled to the signal generating circuit 740 and the power supply circuit 750 configured to receive the first clock Ck, the second clock XCK, the first enabling signal EN, the second enabling signal EN_BAR, the high reference voltage VGH and the low reference voltage VGL.

Although in the first embodiment to the third embodiment, the first switch M1 to the sixteenth switch M16 are P-type thin film transistors, in the present invention, they can be replaced with CMOS or N-type thin film transistors. However, the P-type thin film transistors have higher yield rate and are convenient to be manufactured, and the characteristics of the PMOS such as I-V curve and threshold voltage are superior to those of the NMOS. Since the shift register circuitry 3000 and the display 7000 of the present invention utilize PMOS thin film transistors, e.g. the first switch M1 to the sixteenth switch M16, the overall performances of the shift register circuitry 3000 and the display 7000 are improved.

In view of above, through utilizing the shift register circuitry 3000 of the present invention, the modified scan signal generated by each stage of shift registers does not overlap with the modified scan signal provided by the previous stage shift register in time sequence, the display 7000 and the display applying the shift register 3000 can correctly display colors according to data signals. Besides, Since the shift register circuitry 3000 and the display 7000 of the present invention utilize PMOS thin film transistors, the overall performances of the shift register circuitry 3000 and the display 7000 are improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A shift register circuitry comprising a plurality of stages of shift registers, each of the plurality of stages of shift registers is configured to provide an unmodified scan signal and a modified scan signal of said each of the plurality of stages of shift registers, an Nth stage shift register of the plurality of stages of shift registers comprising:

an output unit, coupled to a register control end of the Nth stage shift register configured to receive a first clock, and outputting an unmodified Nth stage scan signal from a first output end of the Nth shift register according to the first clock and voltage level of the register control end;

an input unit, coupled to the output unit through the register control end, configured to receive a second clock other than the first clock, receiving an unmodified (N−M) stage scan signal provided by an (N−M)th stage shift register of the plurality of stages of shift registers, and controlling the voltage level of the register control end according to the unmodified (N−M)th stage scan signal and the second clock;

a first control unit, coupled to the register control end, configured to receive a low reference voltage, a high reference voltage and the voltage level of the register control end, and controlling voltage level of an output end of the first control unit according to the voltage level of the register control end;

a first pull-up unit, coupled to the output end of the first control unit and the register control end, configured to receive the high reference voltage and the voltage level of the first control unit, and controlling the voltage level of the register control end according to the voltage level of the output end of the first control unit;

a second pull-up unit, coupled to the output end of the first control unit and the output unit, configured to receive the high reference voltage, and controlling the voltage level of an output end of the Nth stage shift register; and a modification circuit, coupled to the output end of the first control unit and the first output end of the Nth stage shift register, configured to receive the unmodified Nth stage scan signal, the high reference voltage, the second clock, a first enabling signal and a second enabling signal, and generating a modified Nth stage scan signal at a second output end of the Nth stage shift register according to the unmodified Nth stage scan signal.

2. The shift register circuitry of claim 1, wherein the output unit comprises a first switch having a first end configured to receive the first clock, a second end configured to output the unmodified Nth stage scan signal and a control end coupled to the register control end.

3. The shift register circuitry of claim 2, wherein the output unit further comprises an eleventh switch having a first end configured to receive the first clock, a second end configured to output the unmodified Nth stage scan signal and a control end coupled to the register control end.

4. The shift register circuitry of claim 1, wherein the input unit comprises:
 a second switch having a first end, a control end configured to receive the second clock, and a second end configured to receive the unmodified (N−M)th stage scan signal;
 a third switch having a first end coupled to the second end of the second switch, a control end configured to receive the second clock, and a second end coupled to the register control end; and
 a fourth switch having a first end coupled to the first output end of the Nth stage shift register, a second end coupled to the first end of the second switch, and a control end coupled to the first end of the fourth switch.

5. The shift register circuitry of claim 1, wherein the first control unit comprises:
 a switch set having a first end and a control end configured to receive the low reference voltage, and a second end coupled to the output end of the first control unit; and
 a fifth switch having a first end coupled to a second end of the switch set, a control end coupled to the register control end, and a second end configured to receive the high reference voltage.

6. The shift register circuitry of claim 5, wherein the switch set comprises:
 a twelfth switch having a first end configured to receive the low reference voltage, a control end configured to receive the low reference voltage, and a second end; and
 a thirteenth switch having a first end coupled to the second end of the twelfth switch, a control end configured to receive the low reference voltage, and a second end coupled to the first end of the fifth switch.

7. The shift register circuitry of claim 1, wherein the first pull-up unit comprises:
 a fourteenth switch having a first end, a control end coupled to the output end of the first control unit, and a second end configured to receive the high reference voltage; and
 a fifteenth switch having a first end coupled to the register control end, a control end coupled to the control end of the fourteenth switch, and a second end coupled to the first end of the fourteenth switch.

8. The shift register circuitry of claim 1, wherein the second pull-up unit has a first end configured to output the unmodified Nth stage scan signal, a control end coupled to the first control unit, and a second end configured to receive the high reference voltage.

9. The shift register circuitry of claim 1, wherein the modification circuit comprises:
 a sixth switch having a first end, a control end configured to receive the first enabling signal, and a second end coupled to the first output end of the Nth shift register;
 a seventh switch having a first end configured to output the modified Nth stage scan signal, a control end coupled to the output end of the first control unit, and a second end configured to receive the high reference voltage;
 an eighth switch having a first end coupled to the first end of the seventh switch, a second end configured to receive the second clock, and a control end configured to receive the high reference voltage;
 a ninth switch having a first end configured to receive the second enabling signal, a control end coupled to the first end of the sixth switch, and a second end coupled to the first end of the seventh switch; and
 a tenth switch having a first end coupled to the first end of the seventh switch, a control end configured to receive the first enabling signal, and a second end configured to receive the high reference voltage.

10. The shift register circuitry of claim 9, wherein the modification circuit further comprises a capacitor coupled between the first and second ends of the sixth switch.

11. The shift register circuitry of claim 1, wherein phases of the first enabling signal are logically inversed relative to phases of the second enabling signal, and the phases of the first clock are logically inversed relative to phases of second clock.

12. A display comprising:
 a plurality of pixels;
 a data driver coupled to the pixels configured to individually provide display signals to the pixels;
 a signal generating circuit comprising:
  a first clock output end configured to provide a first clock;
  a second clock output end configured to provide a second clock other than the first clock;
  a first enabling signal output end configured to provide a first enabling signal;
  a second enabling signal output end configured to provide a second enabling signal other than the first enabling signal;
 a power supply circuit comprising:
  a high reference voltage output end configured to provide a high reference voltage; and
  a low reference voltage output end configured to provide a low reference voltage; and
 a scan driver, coupled to the pixels configured to provide a plurality of scan signals to control the pixels individually receiving display signals, comprising:
  a shift register circuitry comprising a plurality of stages of shift registers, each of the plurality of stages of shift registers is used configured to provide an unmodified scan signal and a modified scan signal of the each of the plurality of stages of shift registers, an Nth stage shift register of the plurality of stages of shift registers comprising:
   an output unit, coupled to a register control end of the Nth stage shift register configured to receive a first clock, and outputting an unmodified Nth stage scan signal from a first output end of the Nth shift register according to the first clock and voltage level of the register control end;
   an input unit, coupled to the output unit through the register control end, configured to receive the second clock, receiving an unmodified (N−M) stage scan signal provided by an (N−M)th stage shift register of the plurality of stages of shift registers, and controlling the voltage level of the register control end according to the unmodified (N−M)th stage scan signal and the second clock;
   a first control unit, coupled to the register control end, configured to receive the low reference voltage, the high reference voltage and the voltage level of the register control end, and controlling voltage level of an output end of the first control unit according to the voltage level of the register control end;
a first pull-up unit, coupled to the output end of the output end of the first control unit and the register control end, configured to receive the high reference voltage and the voltage level of the output end of the first control unit, and controlling the voltage level of the register control end according to the voltage level of the output end of the first control unit;
a second pull-up unit, coupled to the output end of the first control unit and the output unit, configured to receive the high reference voltage, and controlling the voltage level of an output end of the Nth stage shift register; and
a modification circuit, coupled to the output end of the first control unit and the first output end of the Nth stage shift register, configured to receive the unmodified Nth stage scan signal, the high reference voltage, the second clock, a first enabling signal and a second enabling signal, and generating a modified Nth stage scan signal at a second output end of the Nth stage shift register according to the unmodified Nth stage scan signal.

13. The display of claim 12, wherein:
the output unit comprises:
a first switch having a first end configured to receive the first clock, a second end configured to output the unmodified Nth stage scan signal and a control end coupled to the register control end; and
an eleventh switch having a first end configured to receive the first clock, a second end configured to output the unmodified Nth stage scan signal and a control end coupled to the register control end;
the input unit comprises:
a second switch having a first end, a control end configured to receive the second clock, and a second end configured to receive the unmodified (N−M)th stage scan signal;
a third switch having a first end coupled to the second end of the second switch, a control end configured to receive the second clock, and a second end coupled to the register control end; and
a fourth switch having a first end coupled to the first output end of the Nth stage shift register, a second end coupled to the first end of the second switch, and a control end coupled to the first end of the fourth switch;
the first control unit comprises:
a switch set comprising:
a first end;
a control end configured to receive the low reference voltage;
a twelfth switch having a first end configured to receive the low reference voltage, a control end configured to receive the low reference voltage, and a second end; and
a thirteenth switch having a first end coupled to the second end of the twelfth switch, a control end configured to receive the low reference voltage, and a second end; and
a fifth switch having a first end coupled to a second end of the switch set and to the second end of the thirteenth switch, a control end coupled to the register control end, and a second end configured to receive the high reference voltage;
the first pull-up unit comprises:
a fourteenth switch having a first end, a control end coupled to the output end of the first control unit, and a second end configured to receive the high reference voltage; and
a fifteenth switch having a first end coupled to the register control end, a control end coupled to the control end of the fourteenth switch, and a second end coupled to the first end of the fourteenth switch;
the second pull-up unit has a first end configured to output the unmodified Nth stage scan signal, a control end coupled to the first control unit, and a second end configured to receive the high reference voltage;
the modification circuit comprises:
a sixth switch having a first end, a control end configured to receive the first enabling signal, and a second end coupled to the first output end of the Nth shift register;
a seventh switch having a first end configured to output the modified Nth stage scan signal, a control end coupled to the output end of the first control unit, and a second end configured to receive the high reference voltage;
an eighth switch having a first end coupled to the first end of the seventh switch, a second end configured to receive the second clock, and a control end configured to receive the high reference voltage;
a ninth switch having a first end configured to receive the second enabling signal, a control end coupled to the first end of the sixth switch, and a second end coupled to the first end of the seventh switch; and
a tenth switch having a first end coupled to the first end of the seventh switch, a control end configured to receive the first enabling signal, and a second end configured to receive the high reference voltage;
the modification circuit further comprises a capacitor coupled between the first and second ends of the sixth switch; and
phases of the first enabling signal are logically inversed relative to phases of the second enabling signal, and the phases of the first clock are logically inversed relative to phases of the second clock.

14. A shift register comprising:
an output unit comprising a first switch having a first end configured to receive a first clock, a second end configured to output an unmodified Nth stage scan signal, and a control end coupled to a register control end of the shift register;
an input unit comprising:
a second switch having a first end, a control end configured to receive a second clock, and a second end configured to receive an unmodified (N−M)th stage scan signal;
a third switch having a first end coupled to the second end of the second switch, a control end configured to receive the second clock, and a second end coupled to the register control end; and
a fourth switch having a first end coupled to a first output end of the Nth stage shift register, a second end coupled to the first end of the second switch, and a control end coupled to the first end of the fourth switch;
a first control unit comprising:
a switch set having a first end and a control end configured to receive a low reference voltage; and
a fifth switch having a first end coupled to a second end of the switch set, a control end coupled to the register control end, and a second end configured to receive a high reference voltage;

a first pull-up unit, configured to pull up voltage level of the register control end, having a first end coupled to the first end of the register control end, a control end, and a second end configured to receive the high reference voltage;

a second pull-up unit having a first end configured to output the unmodified Nth stage scan signal, a control end coupled to the first control unit, and a second end configured to receive the high reference voltage; and a modification circuit comprising:

a sixth switch having a first end coupled to the control end of the first pull-up unit, a control end configured to receive a first enabling signal, and a second end coupled to the first output end of the Nth shift register;

a seventh switch having a first end configured to output the modified Nth stage scan signal, a control end coupled to an output end of the first control unit, and a second end configured to receive the high reference voltage;

an eighth switch having a first end coupled to the first end of the seventh switch, a second end configured to receive the second clock, and a control end configured to receive the high reference voltage;

a ninth switch having a first end configured to receive a second enabling signal, a control end coupled to the first end of the sixth switch, and a second end coupled to the first end of the seventh switch; and a tenth switch having a first end coupled to the first end of the seventh switch, a control end configured to receive the first enabling signal, and a second end configured to receive the high reference voltage.

15. The shift register of claim 14, wherein the output unit further comprises an eleventh switch having a first end configured to receive the first clock, a second end configured to output the unmodified Nth stage scan signal and a control end coupled to the register control end.

16. The shift register of claim 14, wherein the switch set comprises:

a twelfth switch having a first end configured to receive the low reference voltage, a control end configured to receive the low reference voltage, and a second end; and a thirteenth switch having a first end coupled to the second end of the twelfth switch, a control end configured to receive the low reference voltage, and a second end coupled to the first end of the fifth switch.

17. The shift register of claim 14, wherein the first pull-up unit comprises:

a fourteenth switch having a first end, a control end coupled to the output end of the first control unit, and a second end configured to receive the high reference voltage; and a fifteenth switch having a first end coupled to the register control end, a control end coupled to the control end of the fourteenth switch, and a second end coupled to the first end of the fourteenth switch.

18. The shift register of claim 14, wherein the modification circuit further comprises a capacitor coupled between the first and second ends of the sixth switch.

19. The shift register of claim 14, wherein phases of the first enabling signal are logically inversed relative to phases of the second enabling signal, and the phases of the first clock are logically inversed relative to phases of the second clock.

* * * * *